(12) United States Patent
Abbott

(10) Patent No.: US 6,545,342 B1
(45) Date of Patent: Apr. 8, 2003

(54) PRE-FINISHED LEADFRAME FOR SEMICONDUCTOR DEVICES AND METHOD OF FABRICATION

(75) Inventor: Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/561,798

(22) Filed: May 1, 2000

Related U.S. Application Data
(60) Provisional application No. 60/132,220, filed on May 3, 1999.

(51) Int. Cl.[7] ............................................. H01L 23/495
(52) U.S. Cl. ....................... 257/666; 257/761; 257/766; 257/767
(58) Field of Search .............................. 257/666, 741, 257/750, 766, 762, 761, 781, 787

(56) References Cited

U.S. PATENT DOCUMENTS

| | | | | |
|---|---|---|---|---|
| 4,707,724 A | * | 11/1987 | Suzuki | 357/71 |
| 5,001,546 A | * | 3/1991 | Butt | 357/71 |
| 5,138,431 A | * | 8/1992 | Huang | 357/71 |
| 5,343,073 A | * | 8/1994 | Parthasarathi | 257/666 |
| 5,449,951 A | * | 9/1995 | Mahulikar | 257/677 |
| 5,540,378 A | * | 7/1996 | Mahulikar | 257/666 |
| 5,563,442 A | * | 10/1996 | Mahulikar | 257/666 |
| 5,583,379 A | * | 12/1996 | Sato | 257/736 |
| 5,623,123 A | * | 4/1997 | Umehara | 257/676 |
| 5,635,755 A | * | 6/1997 | Kinghorn | 257/666 |
| 5,650,661 A | * | 7/1997 | Mathew | 257/677 |
| 5,675,177 A | * | 10/1997 | Abys | 257/666 |
| 5,889,317 A | * | 3/1999 | Huang | 257/666 |
| 5,969,414 A | * | 10/1999 | Mahulikar | 257/675 |

FOREIGN PATENT DOCUMENTS

JP 406132446 A * 5/1994

* cited by examiner

Primary Examiner—Olik Chaudhuri
Assistant Examiner—Nathan W. Ha
(74) Attorney, Agent, or Firm—Michael K. Skrehot; Wade James Brady, III; Frederick J. Telecky, Jr.

(57) ABSTRACT

A leadframe for use with integrated circuit chips comprising a base metal, usually copper or a copper alloy, having a modified surface adapted to provide bondability and solderability and adhesion to polymeric compounds. The modified surface comprises a layer created by converting a percentage of base metal atoms into substitutional metal complexes, usually hydrated chromates. A thin layer of plated copper may be employed for controlling uniformity and consistency of the replacement reaction.

17 Claims, 1 Drawing Sheet

PRE-FINISHED LEADFRAME FOR SEMICONDUCTOR DEVICES AND METHOD OF FABRICATION

This application claims the benefit of provisional application No. 60/132,220, filed May 3, 1999.

FIELD OF THE INVENTION

The present invention is related in general to the field of semiconductor devices and processes and more specifically to the materials and fabrication of leadframes for integrated circuit devices.

DESCRIPTION OF THE RELATED ART

The leadframe for semiconductor devices was invented (U.S. Pat. No. 3,716,764 and No. 4,034,027) to serve several needs of semiconductor devices and their operation simultaneously: First of all, the leadframe provides a stable support pad for firmly positioning the semiconductor chip, usually an integrated circuit (IC) chip. Since the leadframe including the pads is made of electrically conductive material, the pad may be biased, when needed, to any electrical potential required by the network involving the semiconductor device, especially the ground potential.

Secondly, the leadframe offers a plurality of conductive segments to bring various electrical conductors into close proximity of the chip. The remaining gap between the ("inner") tip of the segments and the conductor pads on the IC surface are typically bridged by thin metallic wires, individually bonded to the IC contact pads and the leadframe segments. Obviously, the technique of wire bonding implies that reliable welds can be formed at the (inner) segment tips.

Thirdly, the ends of the lead segment remote from the IC chip ("outer" tips) need to be electrically and mechanically connected to "other parts" or the "outside world", for instance to assembly printed circuit boards. In the overwhelming majority of electronic applications, this attachment is performed by soldering. Obviously, the technique of soldering implies. that reliable wetting and solder contact can be performed at the (outer) segment tips.

It has been common practice to manufacture single piece leadframes from thin (about 120 to 250 $\mu$m) sheets of metal. For reasons of easy manufacturing, the commonly selected starting metals are copper, copper alloys, iron-nickel alloys for instance the so-called "Alloy 42"), and invar. The desired shape of the leadframe is etched or stamped from the original sheet. In this manner, an individual segment of the leadframe takes the form of a thin metallic strip with its. particular geometric shape determined by the design. For most purposes, the length of a typical segment is considerably longer than its width.

In the European patent # 0 335 608 B1, issued Jun. 14, 1995 (Abbott, "Leadframe with Reduced Corrosion"), a palladium-plated leadframe is introduced which is not subject to corrosion due to galvanic potential forces aiding the migration of the base metal ions to the top surface where they will form corrosion products. The patent describes a sequence of layers consisting of nickel (over the base metal), palladium/nickel alloy, nickel, and palladium (outermost). This technology has been widely accepted by the semiconductor industry for copper-based leadframes.

After assembly on the leadframe, most ICs are encapsulated, commonly by plastic material in a molding process. It is essential that the molding compound, usually an epoxy-based thermoset compound, has good adhesion to the leadframe and the device parts it encapsulates. Palladium, described above as the outermost layer of the leadframe, offers excellent adhesion to molding compounds.

Unfortunately, palladium is expensive; its price limbed in the last decade from about one third of the gold rice to about 20% higher than gold. Cost reduction pressures in semiconductor manufacturing have initiated efforts to reduce the thickness of the palladium layers employed to about one third of its previous thickness. At this thinness, palladium does not prevent oxidation of the underlying nickel which will inhibit its solderability. A method introduced in semiconductor manufacturing uses a thin layer of gold on the palladium surface to prevent oxidation. One related example is described in U.S. Pat. No. 5,859,471, issued on Jan. 12, 1999 (Kuraishi et al., "Semiconductor Device having TAB Tape Leadframe with Reinforced Outer Leads").

In these methods, however, the entire surfaces of the leadframe are plated with gold. This practice severely inhibits the adhesion of the leadframe segments to molding compounds and risks delamination in thermomechanical stress testing. Furthermore, the plating of the complete leadframe with a thin gold layer makes it impossible to decide by visual inspection whether a leadframe has the gold surface or not. Such standard simple inspection, however, is highly desirable as manufacturing practice. Finally, the deposition of gold in unnecessary areas is counterproductive to cost saving efforts.

A more cost-effective method of gold-spot plating is described in U.S. Patent Application No. 60/125,304, filed on Mar. 19, 1999 (Abbott et al., "Gold Spot Plated Leadframes for Semiconductor Devices and Method of Fabrication"). It is till based, though, on the technology of preplating and depositing layers of precious metal onto the metal base, usually copper. Consequently, leadframes using this method and related techniques of preplating will remain a high-cost part in semiconductor packages.

An urgent need has therefore arisen for a radically new low-cost, reliable mass production method for semiconductor leadframes—especially for the widely accepted copper leadframes—which provides all the assembly features leadframes are expected to offer: Bondability, solderability, and adhesion to polymeric compounds. The new leadframe and its method of fabrication should be flexible enough to be applied for different semiconductor product families and a wide spectrum of design and assembly variations, and should achieve improvements toward the goals of improved process yields and device reliability. Preferably, these innovations should be accomplished using the installed equipment base so that no investment in new manufacturing machines is needed.

SUMMARY OF THE INVENTION

According to the present invention for a semiconductor integrated circuit (IC) leadframe, the base metal of the leadframe has a modified surface, comprising a layer created by converting a percentage of the base metal atoms into substitutional metal complexes and adapted to provide bondability and solderability and adhesion to polymeric compounds. The leadframe is fabricated by first cleaning and activating the leadframe surface, and then immersing the activated leadframe into a chromating solution containing chromic acid and an activator, thereby converting surface atoms of the base metal into chromate complexes and creating a surface layer comprising chromic and base metal reaction products. The technique is especially applicable to copper-based leadframes. For controlling uniformity and consistency, a layer of base metal material may be plated onto the cleaned leadframe before proceeding with the surface activation step.

The present invention is related to high density ICs, especially those having high numbers of inputs/outputs., and also to low end, low cost devices. These ICs can be found in many semiconductor . device families such as standard linear and logic products, digital signal processors, microprocessors, digital and analog devices, high frequency and high power devices, and both large and small area chip categories. The package type can be plastic dual in-line packages (PDIPs), small outline ICs (SOICs), quad flat packs QFPs), thin QFPs (TQFPs), SSOPs, TSSOPs, TVSOPs, and other leadframe-based packages.

Since there is no nickel, silver, palladium, or gold in the leadframe of the finished package, the invention represents a significant cost reduction of the semiconductor packages, especially the plastic molded packages, compared to the conventional copper-based nickel-palladium-plated leadframes.

The theory underlying the surface conversion of a base metal can, for example, be found in "Metal Finishing", Guidebook and Directory Issue 98, January 1998, volume 95, number 1; published by Metal Finishing, 660 White Plains Ave., Tarrytown, N.Y. 10591. "Chromate conversion coatings are chemical conversion coatings. The substrate metal participates in the coating reactions and becomes a component of the coating." "Film formation—the films in most common use are formed by the chemical reaction of hexavalent chromium with a metal surface in the presence of other components, or 'activators', in an acid solution. The hexavalent chromium is partially reduced to trivalent chromium during the reaction, with a concurrent rise in pH, forming a complex mixture consisting largely of hydrated basic chromium chromate and hydrous oxides of both chromium and the basis metal. The composition of the film is rather indefinite, because it contains varying quantities of the reactants, reaction products and water of hydration, as well as the associated ions of the particular systems."

It is an aspect of the invention to provide a technology for modifying the surfaces of copper or copper-alloy-based leadframes to provide bondability, solderability and adhesion to polymeric die-attach and molding compounds, without requiring costly fabrication processes.

The bondability is compatible with the conditions defined by fine-pitch bonding. The solderability conforms with surface mount technologies based on bending the package leads and solder attaching lead portions without flux (or only very mild fluxes not requiring rinse steps). The end user of the semiconductor product can continue to employ the installed assembly equipment base. The excellent adhesion to die attach and molding compounds used on plastic packages prevents delamination, moisture ingress, and corrosion.

Another aspect of the invention is to reach these goals without the cost of equipment changes and new capital investment and using the installed fabrication equipment base. The alkaline elctroclean and flood and soak baths are standard; the mass production processes are based on reel-to-reel manufacturing. The line is very short and the process very fast.

Another aspect of the present invention is the option of modifying the fabrication process by depositing a plated layer of copper onto the cleaned leadframe. This modification provides controlled uniformity and consistency to the replacement reaction and the conversion to substitutional metal complexes.

Another aspect of the invention is the standard appearance of the finished product. For copper or copper-plated leadframes according to the invention, the leadframe looks coppery with a light gray cast to it, and as a finished device, the external leads look similar to the leadframe.

These aspects have been achieved by the teachings of the present invention concerning surface atoms replacement reactions. Various modifications of leadframe preparations have been successfully employed.

In the first preferred embodiment of the invention, strip-shaped leadframes, made of copper or copper alloys, are processed in reel-to-reel fabrication equipment. After proceeding through alkaline electro-clean and activation baths, the leadframes are exposed to a non-electrolytic chromate conversion reaction, in which copper surface atoms are replaced by a mixture of chromium, hydrous oxide and copper complexes. Appropriate rinsing steps are inserted.

In the second preferred embodiment of the invention, strip-shaped leadframes, made of copper or copper alloys, are processed in reel-to-reel fabrication equipment. After proceeding through an alkaline electro-clean bath, the leadframes receive a plated layer of pure copper in controlled grain structure, uniformity and consistency. The subsequent process steps of activation and chromation are the same as in the first preferred embodiment.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to a pre-plated leadframe of lower total cost of ownership for IC assembly/ test houses and semiconductor manufacturers. The invention provides the fabrication of a leadframe with the attributes and functionalities of a preplated leadframe without additionally depositing a layer of solderable metal and protective, usually noble, metal. For copper as a starting material, the invention eliminates the conventional need of a nickel layer (nickel is on the EPA list of toxic chemicals and targeted for reduction/ elimination from industrial processes in the future) and a palladium layer (as a precious metal, palladium is expensive and subject to market price variations and supply uncertainties). Instead, the invention provides a chromate conversion or similar modified surface of the starting metal.

As defined herein, the starting material of the leadframe is called the "base metal", indicating the type of metal. Consequently, the term "base metal" is not to be construed in an electrochemical sense (as in opposition to 'noble metal') or in a structural sense. The base metal of leadframes is typically copper or copper alloys. Other choices comprise brass, aluminum, iron-nickel alloys ("Alloy 42"), and invar.

The invention reduces the cost of leadframes while the leadframe functions are improved. The invention best applies to any leadframe and any substrate used in semiconductor technology which exhibit the following design features: Usually, a chip pad for support of the IC chip surrounded by lead segments having an inner tip in proximity of the chip pad, and outer tips remote from the chip pad. The invention thus applies to semiconductor package types such as PDIPs, SOICs, QFPs, SSOPs, TQFPs, TSSOPs and TVSOPs.

Leadframe surfaces have to satisfy five needs in semiconductor assembly:

1) Leadframes have to comprise outer segment tips with surfaces suitable for solder attachment to other parts;
2) leadframes have to comprise inner segment tips with surfaces suitable for bond attachments to wires;
3) leadframes have to comprise outer segments ductile,for forming and bending the segments;
4) leadframe surfaces have to comprise surfaces suitable for adhesion to polymer chip attach materials and molding compounds; and
5) leadframe segments have to comprise surfaces, insensitive. to corrosion.

According to the teachings of this invention, all these needs are satisfied by the modified surface of the base metal, created by the replacement reaction of the chromate conversion coating.

Figure 1:
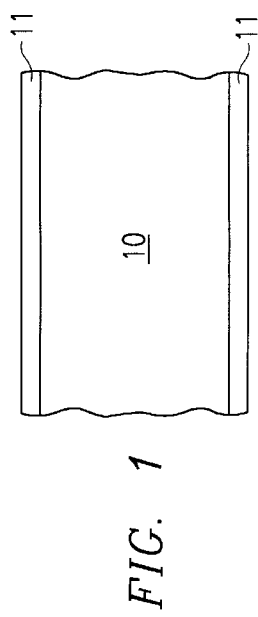
FIG. 1 is a schematic cross sectional view of a portion of a leadframe made according to the first embodiment of the invention.

In the embodiment of the invention in FIG. 1, the schematic cross-section of a leadframe portion illustrates a starting, or base metal 10. The base metal is preferably made of copper or copper alloy. Other choices for the base metal include brass, aluminum, an iron nickel alloy such as "Alloy 42", and invar. The base metal is of a sheet-like configuration having a preferred thickness in the range from about 100 to 300 $\mu$m; thinner sheets are possible. The ductility in this thickness range provides the 5 to 15% elongation needed in the segment bending and forming operation. The leadframe is stamped or etched from the starting metal sheet.

Processed in a reel-to-reel fashion, the stamped or etched leadframe is first immersed in an alkaline soak and electro-clean solution at 20 to 90° C. for few seconds up to 1 minute. The alkaline solution may comprise a mixture of sodium hydroxide, sodium bicarbonate, sodium triphosphate, and a wetting agent. In this process step, oils, grease, mill and stamping soil, dirt and other contamination are removed.

A typical alkaline cleaner is composed of

NaOH 5 to 8 oz/gal,

Na2CO3 10 to 15 oz/gal,

Na3PO4 8 to 15 oz/gal,

Wetting agent 0.1 oz/gal, and operates at 60° C. for 10 s with vigorous agitation. The cleaning step is followed by rinsing. Cleaning and rinsing may be repeated in several sequential tanks.

Next, the cleaned leadframe is immersed in an acid activation bath for removal of metal oxides. Typically, the acid solution comprises diluted sulfuric or hydrochloride acid in a concentration suitable for copper oxide removal. A preferred solution comprises H2SO4 5 to 10% per volume, or HCl 10 to 20% per volume, up to 50%, and operates at room temperature for 5 seconds with vigorous agitation. Other acids may be used. The activation step is followed by rinsing.

Next, the activated leadframe is immersed in a chromating solution for a surface atom replacement reaction. The chromating solution comprises chromic acid and an activator, thereby converting copper surface atoms into chromate complexes and creating a surface layer comprising chromic and copper reaction products. A preferred chromating solution consists of chromic (IV) acid along with other ionic activators such as sulfate, chloride, acetate, sulfamate, phosphate, nitrate, fluoride, or formate, in a concentration suitable for reacting with, and somewhat dissolving, a percentage of copper atoms, while partially reducing the hexavalent chromium to trivalent chromium. As a result, a layer is deposited onto the leadframe comprising a complex mixture of hydrated basic chromium chromate and hydrous oxides of chromium and copper, along with some copper species. It is, in summary, a complex immersion coating technique. There is no applied potential used in this method, which is non-electrolytic.

Simple reel-to-reel plating equipment is used. Only for the alkaline electro-clean process step are rectifiers needed; the other process and rinse steps require just simple flood/soak baths. The overall manufacturing line is short, and the process is fast.

The percentage of copper atoms exchanged is in the range from about 90 to 99.5% of surface and surface-near atoms. The surface layer of substitutional metal complexes has a thickness in the range from about 20 to 1250 nm. In FIG. 1, the substitutional layer 11 is shown on both surfaces in the cross section of the leadframe sheet.

The substitutional layer 11 created by the complex coating technique gives the leadframe a coppery look with a light gray cast to it. The presence of the layer is easily detected by Auger spectroscopy, looking for chromium on the external leadframe segments. The substitutional layer gives the leadframe the desired characteristics listed above.

Other straight immersion/conversion coating techniques for treating the surface of copper involve silver and gold. Both of these immersion techniques work because of the relative position of the elements in the EMF (electromotive force) series. Silver, however, is a risky choice because of the potential for dendritic growth. Gold is more straightforward, but has to be used with caution because it may lower the adhesion of the treated leadframe to certain thermoset molding compounds.

The leadframe having a surface modified as described above is adapted to provide excellent bondability to bonding wires. Typically, bonding wires are selected from a group consisting of gold, copper, aluminum, and alloys thereof. The thickness range usually is between about 18 to 33 $\mu$m. The stitch welds of the bonds are fixed onto the ends of the leadframe segments near the chip mount pad (often referred to as "first ends" of the segments). Alternatively, welds made by wedge bonds or ball bonds can be successfully affixed to the adapted surface of the leadframe segments. Low bonding temperatures (between about 150 and 220° C.) are preferred.

The modified surface of the leadframe improves the ductility of the outer ends of the leadframe segments, remote from the chip mount pad (often referred to as "second ends"), so that the segments can be formed and bent. In this fashion the segments obtain a form suitable for solder attachment.

Furthermore, the modified surface of the leadframe adapts these segment ends very well for solderability. The materials commonly used for solder attachment are selected from a group consisting of tin/lead, tin/indium, tin/silver, tin/bismuth, and conductive adhesive compounds.

The modified surface of the leadframe proves to be insensitive to corrosion.

It is important for the present invention that the modified surface of the leadframes are exceptionally suitable for adhesion to polymer compounds used for chip attachment and device encapsulation. For chip attachment, epoxy- or polyimide-based materials are commonly employed, preferably polymerized at relatively low temperatures (for example, between 150 and 200° C.). For device encapsulation, epoxy-based molding compounds are preferred, with polymerization temperatures between about 150 to 180° C. Compounds requiring curing temperatures as low as 120° C. are being introduced; the modified surfaces of the leadframes of the present invention also show excellent adhesion to these molding compounds.

Figure 2:
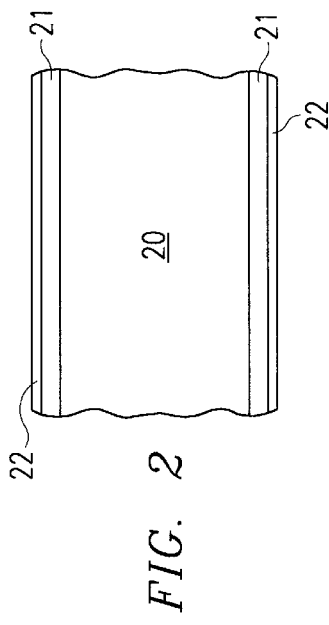
FIG. 2 is a schematic cross sectional view of a portion of a leadframe made according to the second embodiment of the invention.

FIG. 2 shows a second preferred embodiment of the present invention. The schematic cross section of a portion of the leadframe illustrates the base metal 20; it is usually made of copper or a copper alloy; other choices include brass, aluminum, an iron-nickel alloy, and invar. The leadframe is subjected to a cleaning step in alkaline soak and electro-cleaning solutions, as described above. After rinsing, the leadframe surfaces are activated by immersing the leadframe into an acid solution and removing any oxides, as described above. After another rinse step, the layer 21 is then plated on all leadframe surfaces. This layer is made of copper and about 125 to 1000 nm thick. It is characterized by controlled uniformity and consistency, and thus simplifies the control of the subsequent chromate conversion process.

By creating the thin plated copper layer, the chromate formation process becomes independent of grain structure variations of the base metal used and can proceed in very consistent manner. Ideally, the plated copper is deposited from an acid copper plating solution, thus avoiding any cyanides; however, cyanide copper has been found to work nevertheless.

Applying the process described in conjunction with FIG. 1, the copper-plated leadframe is next immersed into a chromating solution containing chromic acid and an activator. Copper surface atoms are thereby converted into chromate complexes. Leadframe surface layer 22 in FIG. 2 comprises chromic and copper reaction products and has a thickness in the range from 20 to 1250 nm.

For best control of the replacement reaction, an additional process step may be applied after the copper plating step, namely the activation of the plated copper surface by immersing the leadframe one more time into an acid solution as described above.

Figure 3:
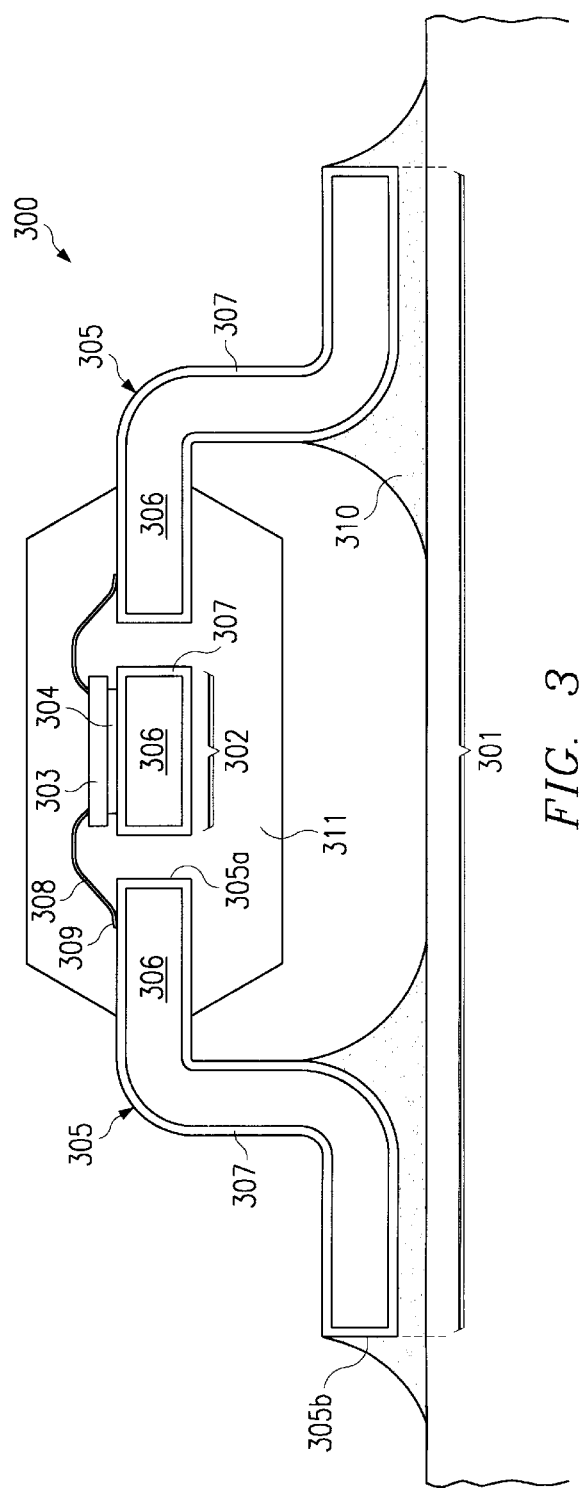
FIG. 3 is a schematic cross sectional view of a plastic packaged semiconductor device having a leadframe according to the invention, solder assembled on a substrate.

In the schematic cross section of FIG. 3, the copper or copper alloy leadframe 301 of the invention is shown as applied in the assembly of a semiconductor package generally designated 300. Leadframe 301 has a chip mount pad 302 onto which an IC chip 303 is attached using adhesive material 304 (typically an epoxy or polyimide which has to undergo polymerization). Leadframe 301 further has a plurality of lead segments 305. These lead segments have a first end 305a near the chip mount pad 302 and their second end 305b remote from mount pad 302.

As shown in FIG. 3 schematically, leadframe 305 comprises base 306 made of copper or copper alloy. On the surface of this copper is the chromated layer 307, described in detail in conjunction with FIG. 1. This layer provides reliable protection against corrosion, reliable adhesion to the chip attach material and the plastic encapsulation compound, and reliable wire bonding for connecting the chip contact pads to the leadframe segments. In FIG. 3, bonding wires 308 have stitches 309 welded to the chromated surface 307 of leadframe segments 305. As mentioned, the bonding wires are selected from a group consisting of gold, copper, aluminum, and alloys thereof. Any of these metals provide reliable welds to the chromated leadframes of the invention.

As shown in FIG. 3, the second ends 305b of segments 305 are suitable for bending and forming due to the ductility of the copper base and the chromated surface layer 307. Using this malleable characteristic, segments 305 may be formed in any shape required for surface mounting or any other technique of board attach of the semiconductor devices. The bending of the segments does not diminish the corrosion protection of the second segment ends 305b. For example, FIG. 3 indicates a so-called "gull wing shape" of segments 305. This shape is widely used for IC packages in the so-called "small outline" configuration, as illustrated in FIG. 3.

The chromated copper leadframe of the invention provides for easy and reliable solder attachment to boards or other parts of the formed leadframe segments. In FIG. 3, solder attach material 310 comprises materials selected from a group consisting of tin/lead mixture, tin/indium, tin/silver, tin/bismuth, and conductive adhesive compounds.

In FIG. 3, molding compound 311 encapsulates. the mounted chip 303, bonding wires 308 and the first ends 305a of the lead segments 305. The second, remote ends 305b of the segments are not included in the molded package; they remain exposed for solder attachment. Typically, the encapsulation material 311 is selected from a group consisting of epoxy-based thermoset molding compounds suitable for adhesion to layer 307 of the leadframe.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the chromate conversion technique may be applied in a somewhat modified version to gold, silver or molybdenum. It is therefore intended that the appended claims encompass any such modifications or embodiments.

I claim:

1. A semiconductor device comprising:
   a leadframe comprising a chip mount pad for an integrated circuit chip and a plurality of lead segments having their first end near said mount pad and their second end remote from said mount pad;
   said leadframe made of a base metal having a surface layer created by converting a percentage of said base metal atoms into substitutional metal complexes;
   an integrated circuit chip attached to said mount pad by a polymeric chip attach material;
   bonding wires interconnecting said chip and said first ends of said lead segments;
   encapsulation material surrounding said chip, said bonding wires and said first ends of said lead segments, whereby the adhesion between said encapsulation material and said surrounded parts is enhanced; and
   said encapsulation material leaving said second ends of said lead segments exposed, whereby said second ends are suitable for bending, for solder attachment to other parts, and for corrosion protection.

2. The device according to claim 1 wherein said bonding wire is selected from a group consisting of gold, solution comprises chromic (VI) acid and other organic acid, or activator, in a solution suitable for reacting with, and somewhat dissolving, said copper, while partially reducing the hexavalent chromium to trivalent chromium and depositing a layer onto said leadframe comprising a complex mixture of hydrated basic chromium chromate and hydrous oxides of chromium and copper.

3. The device according to claim 1 wherein the bonding wire contacts to said first ends of said lead segments comprise welds made by ball bonds, stitch bonds, or wedge bonds.

4. The device according to claim 1 wherein said encapsulation material is a polymeric material selected from a group consisting of epoxy-based molding compounds suitable for adhesion to said leadframe.

5. The device according to claim 1 wherein said solder attachment comprises solder materials selected from a group consisting of tin/lead, tin/indium, tin/silver, tin/bismuth, and conductive adhesive compounds.

6. The device according to claim 1 further comprising lead segments having said second ends bent, whereby said, segments obtain a form suitable for solder attachment.

7. The device according to claim 6 wherein said segment bending does not diminish said corrosion protection of said second segments.

8. A semiconductor device comprising:
    a leadframe comprising a chip mount pad for an integrated circuit chip and a plurality of lead segments having their first end near said mount pad and their second end remote from said mount pad;
    said leadframe made of a base metal having a plated surface layer of copper;
    said plated layer having a modified surface layer created by converting a percentage of said plated metal atoms into substitutional metal complexes;
    an integrated circuit chip attached to said mount pad by a polymeric die attach material;
    bonding wires interconnecting said chip and said first ends of said lead segments;
    encapsulation material surrounding said chip, said bonding wires and said first ends of said lead segments, whereby the adhesion between said encapsulation material and said surrounded parts is enhanced; and
    said encapsulation material leaving said second ends of said lead segments exposed, whereby said second ends are suitable for bending, for solder to attachment to other parts, and for corrosion protection.

9. A leadframe for use with integrated circuit chips comprising:
    a base metal having a modified surface comprising substitutional metal complexes to provide bondability and solderability, and adhesion to polymeric compounds.

10. The leadframe according to claim 1 wherein said modified surface comprises a layer created by converting a percentage of said base metal atoms into substitutional metal complexes including hydrated basic chromium chromate.

11. The leadframe according to claim 1 wherein said base metal is selected from a group consisting of copper, copper alloy, brass, aluminum, iron-nickel alloy, and invar.

12. The leadframe according to claim 1 wherein said base metal comprises a sheet-like starting configuration having a thickness in the range from about 100 to 300 $\mu$m.

13. The leadframe according to claim 1 wherein said substitutional metal is selected from a group consisting of chromium, gold and silver.

14. The leadframe according to claim 1 wherein said percentage of metal atoms is in the range from about 90 to 99.5% of surface and surface-near atoms.

15. The leadframe according to claim 1 wherein said substitutional metal complexes form a surface layer of a thickness in the range from about 20 to 1250 nm.

16. A leadframe for use with integrated circuit chips comprising:
    a base metal having a copper plated surface layer; and
    said plated layer having a modified surface comprising substitutional metal complexes to provide bondability and solderability, and adhesion to polymeric compounds.

17. The leadframe according to claim 16 wherein said plated layer comprises copper in controlled uniformity and consistency in a layer of a thickness in the range from about 125 to 1000 nm.

* * * * *